(12) United States Patent
Chen et al.

(10) Patent No.: US 11,978,758 B2
(45) Date of Patent: May 7, 2024

(54) METHODS AND APPARATUS FOR VIA LAST THROUGH-VIAS

(71) Applicant: Taiwan Semiconductor Manufacturing Co., Ltd., Hsinchu (TW)

(72) Inventors: Szu-Ying Chen, Toufen Township (TW); Pao-Tung Chen, Tainan Hsien (TW); Dun-Nian Yaung, Taipei (TW); Jen-Cheng Liu, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 17/166,387

(22) Filed: Feb. 3, 2021

(65) Prior Publication Data

US 2021/0159264 A1    May 27, 2021

Related U.S. Application Data

(60) Continuation of application No. 16/378,643, filed on Apr. 9, 2019, now Pat. No. 11,600,653, which is a division of application No. 13/678,371, filed on Nov. 15, 2012, now Pat. No. 10,269,863.

(Continued)

(51) Int. Cl.
*H01L 27/14* (2006.01)
*H01L 21/768* (2006.01)
(Continued)

(52) U.S. Cl.
CPC .. *H01L 27/14687* (2013.01); *H01L 21/76898* (2013.01); *H01L 23/49827* (2013.01);
(Continued)

(58) Field of Classification Search
CPC ......... H01L 27/14687; H01L 21/76898; H01L 23/49827; H01L 27/14636; H01L 27/1469
(Continued)

(56) References Cited

U.S. PATENT DOCUMENTS

| 4,059,480 A | 11/1977 | Ruh et al. |
| 5,229,647 A | 7/1993 | Gnadinger |

(Continued)

FOREIGN PATENT DOCUMENTS

| CN | 1338775 | 3/2002 |
| CN | 1901198 A | 1/2007 |

(Continued)

*Primary Examiner* — Ori Nadav
(74) *Attorney, Agent, or Firm* — Slater Matsil, LLP

(57) ABSTRACT

Methods for forming via last through-vias. A method includes providing an active device wafer having a front side including conductive interconnect material disposed in dielectric layers and having an opposing back side; providing a carrier wafer having through vias filled with an oxide extending from a first surface of the carrier wafer to a second surface of the carrier wafer; bonding the front side of the active device wafer to the second surface of the carrier wafer; etching the oxide in the through vias in the carrier wafer to form through oxide vias; and depositing conductor material into the through oxide vias to form conductors that extend to the active carrier wafer and make electrical contact to the conductive interconnect material. An apparatus includes a carrier wafer with through oxide vias extending through the carrier wafer to an active device wafer bonded to the carrier wafer.

20 Claims, 12 Drawing Sheets

Related U.S. Application Data

(60) Provisional application No. 61/625,987, filed on Apr. 18, 2012.

(51) Int. Cl.
   *H01L 23/498* (2006.01)
   *H01L 27/146* (2006.01)
   *H01L 23/538* (2006.01)

(52) U.S. Cl.
   CPC .... *H01L 27/14636* (2013.01); *H01L 27/1469* (2013.01); *H01L 21/76831* (2013.01); *H01L 23/5384* (2013.01); *H01L 27/14634* (2013.01); *H01L 27/1464* (2013.01); *H01L 2223/6622* (2013.01); *H01L 2224/13* (2013.01); *H01L 2924/13091* (2013.01)

(58) Field of Classification Search
   USPC ......................................................... 257/460
   See application file for complete search history.

(56) References Cited

U.S. PATENT DOCUMENTS

| | | | |
|---|---|---|---|
| 6,716,737 B2 | 4/2004 | Plas et al. | |
| 7,335,972 B2 | 2/2008 | Chanchani | |
| 7,485,967 B2 | 2/2009 | Kameyama et al. | |
| 7,777,345 B2 | 8/2010 | Lee et al. | |
| 8,158,515 B2 | 4/2012 | Farooq et al. | |
| 8,421,238 B2 | 4/2013 | Inagaki | |
| 2002/0017710 A1 | 2/2002 | Kurashima et al. | |
| 2006/0087042 A1 | 4/2006 | Kameyama et al. | |
| 2006/0202348 A1 | 9/2006 | Kameyama et al. | |
| 2007/0004121 A1 | 1/2007 | Eckstein et al. | |
| 2007/0158787 A1 | 7/2007 | Chanchani | |
| 2008/0116544 A1 | 5/2008 | Grinman et al. | |
| 2010/0090304 A1 | 4/2010 | Liu et al. | |
| 2010/0193964 A1 | 8/2010 | Farooq et al. | |
| 2010/0308386 A1 | 12/2010 | Abe et al. | |
| 2011/0186951 A1 | 8/2011 | Pyo | |
| 2011/0316068 A1 | 12/2011 | Abbott | |
| 2012/0061789 A1 | 3/2012 | Yang et al. | |
| 2012/0184070 A1 | 7/2012 | Chen et al. | |
| 2012/0267740 A1 | 10/2012 | Okamoto | |

FOREIGN PATENT DOCUMENTS

| | | |
|---|---|---|
| CN | 102403328 | 4/2012 |
| KR | 100881199 | 2/2009 |
| KR | 100881199 B1 | 2/2009 |
| KR | 1020090128899 | 12/2009 |
| TW | 201244046 A | 11/2012 |

METHODS AND APPARATUS FOR VIA LAST THROUGH-VIAS

CROSS REFERENCE TO RELATED APPLICATIONS

This application is a continuation of U.S. application Ser. No. 16/378,643, filed Apr. 9, 2019, entitled "Methods and Apparatus for Via Last Through-Vias," which is a divisional of U.S. application Ser. No. 13/678,371, filed Nov. 15, 2012, now U.S. Pat. No. 10,269,863 issued Apr. 23, 2019, entitled "Methods and Apparatus for Via Last Through-Vias," which is related to, and claims priority to U.S. Provisional Application No. 61/625,987, filed on Apr. 18, 2012, entitled "Fabrication Method of Via-last TOV for BSI Image Sensor and Resulting Structures," each is herein incorporated by reference.

BACKGROUND

In forming conventional through-via (TV) processes for three dimensional (3D) arrangements using semiconductor wafers, low-temperature oxidation is adopted to line through silicon vias (TSVs) with a thin oxide layer to isolate the TSV's from the wafer. Due to the high aspect ratio of a typical TSV, the stress in the trench corners at the bottom of the vias in the wafer may cause oxide cracks, and when the metallization is subsequently formed, metal extrusions (such as copper or Cu extrusions) may form. These cracks and extrusions negatively impact device reliability and performance.

In a particular application of TVs, during fabrication of back side illumination (BSI) CMOS image sensor (CIS) devices, a carrier wafer may be wafer bonded to an active device wafer using wafer bonding. For example, a silicon wafer may be the active device wafer and may have many integrated circuits formed therein, where the integrated circuits are each CIS devices, the integrated circuits each having an array of photodiodes. Several metallization layers may be formed in layers of dielectric material formed over the front side of the active device wafer.

On the opposing back side of the active device wafer, for a back side illuminated (BSI) image sensor, light will allowed to fall on the photodiodes of the BSI CIS devices, and color filter array (CFA) material may be formed over the back side of the active device wafer and aligned with the photodiodes to form color pixels. Microlens (ML) material may be arranged over the CFA material to further increase the light reception. A glass layer may be bonded to the back side of the active device wafer to protect the CIS devices. Materials used for the CFA, ML and bonding material may be particularly sensitive to high temperature processes.

To complete these BSI CIS devices, in a wafer level process, the carrier wafer such as a silicon carrier wafer may be bonded over the front side of the active device wafer. In the conventional approach, TVs may be etched into and through the semiconductor carrier wafer, creating via openings that extend through the carrier wafer. The TVs may be extended to expose a portion of the uppermost metallization layers formed over the active device wafer. A copper conductive material or other conductor may be deposited in the through-vias, and the conductors create electrical paths extending through the carrier wafer.

The silicon etch processes to form TSVs in the carrier wafer, and the related thermal and mechanical stresses that occur, may cause cracks in the upper dielectric layers of the active device wafer. Cracks may form in the liner oxide layer in the vias. Further, copper extrusions may form into these cracks during the copper deposition processes. The processes used in forming the TSVs in the carrier wafer may require high temperature processes. The high temperatures used in these processes may further create undesirable thermal stresses on the devices in the active device wafer and on other materials used.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION

The making and using of the illustrative example embodiments are discussed in detail below. It should be appreciated, however, that this specification provides many applicable concepts that can be embodied in a wide variety of specific contexts. The example embodiments discussed are merely illustrative of specific ways to make and use the various embodiments, and do not limit the scope of the invention or the appended claims.

As will be illustrated in the attached figures, the illustrative embodiments provide for a process for improved reliability of interconnects such as through vias, including through silicon vias or through substrate vias, vias extending through interposers, and the like, all generally referred to herein as TV's. In one application that is particularly well suited to the use of the embodiments, BSI CIS devices are formed in the active device wafer. However, 3D packaging using bonded wafers is increasing and the TVs and methods of the embodiments are applicable to many applications where carrier wafers or carrier substrates having through vias are formed extending to another wafer or substrate. As further provided below, the illustrated embodiments include forming a via with a high density plasma oxide (HDP Ox) process on a carrier wafer. A grinding or polishing step exposes the bottom of the through vias and the HDP Ox. A via opening is later formed in the HDP Ox. The through via formed is then a through oxide via (TOV), as opposed to a prior approach through silicon via (TSV). The TOV may be formed using lower temperature etch processes and lower thermal stresses are thus created. The oxide cracks and metal extrusion observed in the conventional TV approaches are eliminated, providing increased reliability in the finished devices.

Advantageous features of the use of the illustrated embodiments may include: simpler via etching; less thermal impact on materials used in the active device wafer, for example in the BSI CIS application, the thermal impact is lessened on the CFA/ML material and the bonding materials; and the use of the embodiments also provides reduced risk of oxide cracking at the via sidewalls and corners.

Figure 1:
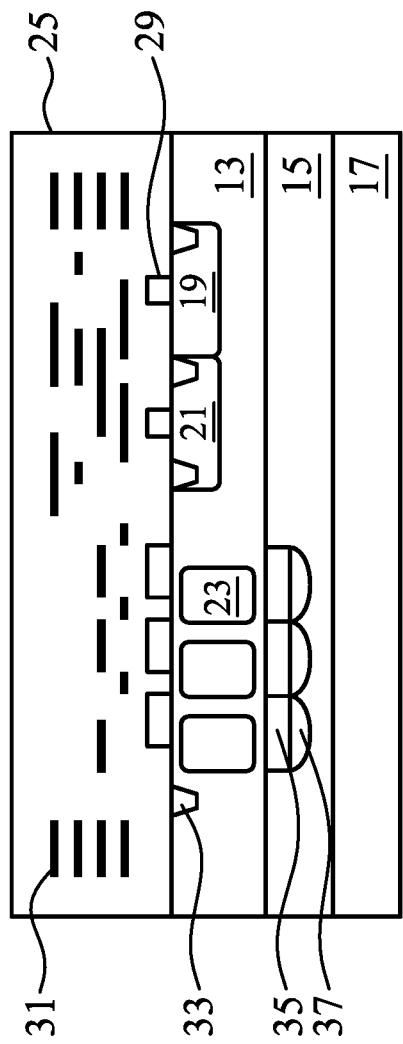
FIG. 1 depicts in a cross sectional view an active device wafer which is a BSI CIS example device for use with the embodiments.

FIG. 1 illustrates, in a cross sectional view, an active device wafer 11. While the examples used herein to illustrate the use of the embodiments describe the active device wafer 11 as a BSI CIS device wafer, the embodiments provide through vias and 3D wafer assemblies that have advantages that are applicable to through vias in wafers and substrates where a carrier wafer is stacked with other devices, without limiting the embodiments to any particular application.

Turning now to FIG. 1, a BSI CIS device 11 is shown. A substrate 13, which may be a silicon wafer or other semiconductor wafer, is provided. An array of photodiodes 23 is formed in a portion of substrate 13. Periphery circuits may include MOS transistors such as 21 and 19, which may be for example, a P-MOS transistor 21 and an N-MOS transistor 19 formed in doped wells. Gate conductors 29, which may be polysilicon, doped polysilicon or other gate material including metal gate material, and which may have sidewall insulators (not shown) formed thereon are shown formed over the transistors formed in doped well regions 21 and 19, and photodiodes 23. As is known, the array of photodiodes 23 may include certain access transistors (not shown for simplicity) such as a charge transfer transistor, read select transistor, and reset transistor in a 3T or 4T photodiode cell. Isolation regions 33, which may be shallow trench isolation (STI) or LOCOS isolation, are shown providing isolation between the photodiodes 23 from the transistor wells 21 and 19, which are also, isolated electrically one from another.

Overlying a front side surface of the wafer 13 is a dielectric structure 25, which may include a plurality of interlevel and intermetal dielectric layers. These layers include the so-called BEOL (back end of line) layers of the active device wafer. The BEOL layers include conductive interconnects as is known in the art.

Materials in dielectric structure 25 may include one or more dielectrics such as silicon dioxide, nitrides, oxides, oxynitrides, and high-k and low-k dielectrics. Conductors such as top level conductor 31 are formed in layers in the dielectric structure 25 and are separated into a plurality of metal layers such as a metal-1, metal-2, etc. metal layers. These are electrically isolated by dielectric layers within dielectric structure 25 and may be formed, for example, using dielectric material that is patterned to form trenches, using electrochemical plating (ECP) to fill the trenches with conductor material such as copper or aluminum copper alloys, and using CMP polishing to then remove excess material at each metallization level; this process is repeated to form the various levels of metallization. Dual damascene and single damascene processes may be used to form the conductors in the dielectric layers.

CFA material 35 is formed over the back side surface of wafer 13. By allowing only red, green or blue light to pass to a corresponding one of the photodiodes 23, the CFA with the photodiodes creates color picture elements (pixels) in the photodiode array of the BSI sensor 11. Microlens (ML) devices 37 collect and focus incipient light onto the CFA and the photodiodes. A temporary bonding material 15 is provided, for example, over the ML devices. A glass substrate 17 is bonded over the backside of the wafer 13 to protect the image sensor photodiodes and this glass substrate 17 completes the backside portion of the BSI CIS device 11.

After the active device wafer 13 is completed and forms the CIS sensor 11, further process steps are needed to form electrical connections to the sensor.

Note that while the BSI CIS sensor 11 is used as a particular example to illustrate the embodiments, the embodiments provide a 3D wafer bonded structure that may be used with any active device wafer type. For example, digital signal processors, memory devices including volatile and non-volatile memories, analog processors, RF circuits, resistors, inductors and capacitors could be used in the active device wafer, any type of device may be formed in the active device wafer and using the embodiments, provided in a 3D packaged arrangement using wafer bonding and through vias to couple the active device wafer to external connections.

Figure 2:
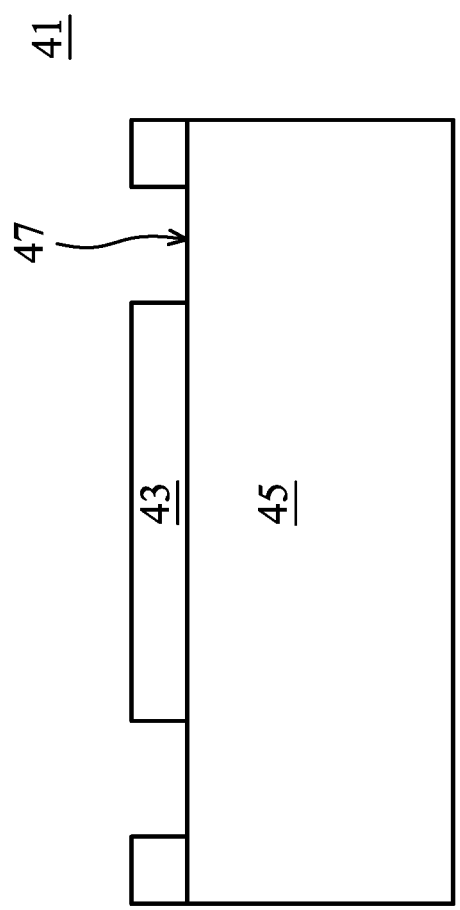
FIG. 2 depicts in a cross sectional view an embodiment carrier wafer at an intermediate processing stage.

FIG. 2 depicts in a cross sectional view an embodiment carrier wafer 41 at an intermediate stage of processing. In the embodiments, the carrier wafer 41 is prepared in a series of front-end processes before being bonded to the active device wafer 11 of FIG. 1. In FIG. 2, a photoresist or hard mask layer 43 is deposited over a wafer 45. The layer 43 is patterned using photolithography and etching steps to form openings 47 corresponding to vias to be formed in wafer 45 as described below. Wafer 45 may be a semiconductor wafer and may be a silicon wafer, although germanium, indium, gallium arsenide and other materials for semiconductor wafers may also be used. Other carrier materials used in wafer bonding such as glass and ceramic could be used for wafer 45, as alternative embodiments.

Figure 3:
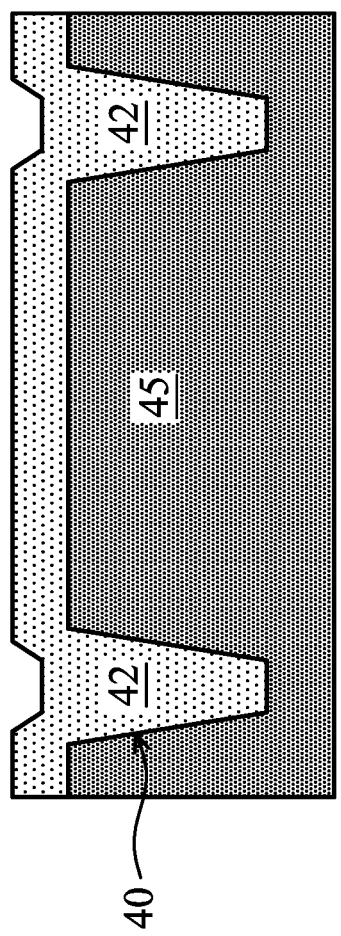
FIG. 3 depicts in a cross sectional view the carrier wafer of FIG. 3 following additional processing.

FIG. 3 depicts in a cross sectional view the carrier wafer 41 of FIG. 2 following some additional processing steps. In transitioning from the cross section of FIG. 2 to that of FIG. 3, an etch process such as a dry etch including plasma etch, RIE etch or the like was used to extend vias 40 into the wafer 45 using the photoresist layer 43 (see FIG. 2) as an etch mask. The photoresist layer 43 was then removed. High density plasma (HDP) processing, for example, may be used to deposit an oxide 42 filling the vias 40, and covering the surface of the wafer 45. HDP oxides may be formed by using a plasma reactor with SiH4 (silane) as a precursor gas and using oxygen to provide the depositing atoms. HDP oxides are dense and form at relatively low temperatures when compared to other oxide depositions. However, the embodiments are not limited to HDP oxide for the oxide layer 42; other materials that could be used include HARP (high aspect ratio processing for CVD), SACVD, BPSG Oxide, as non-limiting examples.

Figure 4:
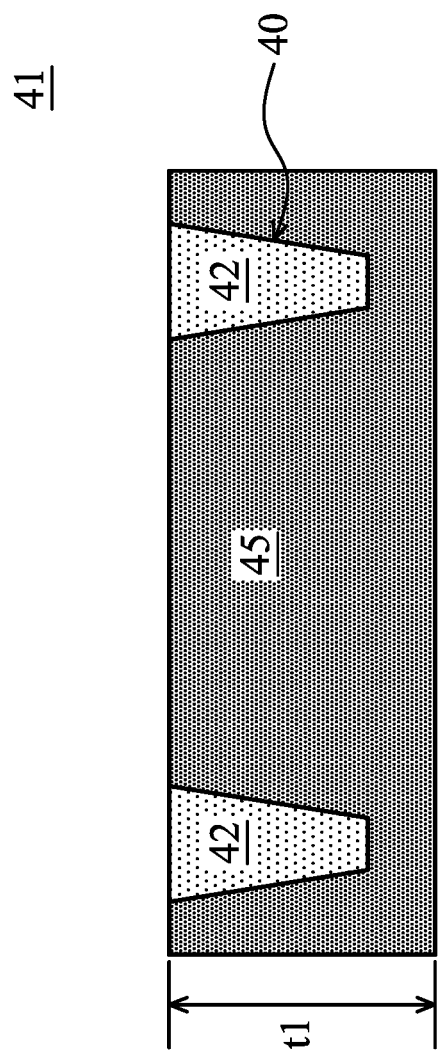
FIG. 4 depicts in a cross sectional view the carrier wafer of FIG. 3 following CMP processing.

FIG. 4 depicts in a cross sectional view the carrier wafer 41 illustrated in FIG. 3, following additional processing steps. To transition from the intermediate stage of FIG. 3 to the stage shown in FIG. 4, a chemical mechanical polishing (CMP) or other oxide removal process such as an etch is used to remove the portion of the oxide 42 from the upper surface of the wafer 45, and if CMP is used, it also may further planarize the upper surface of the wafer 45. Vias 40 then remain filled with the oxide 42. The thickness t1 of the carrier wafer may range from about 400 to about 800 microns. In a non-limiting illustrative example, the carrier wafer 41 may have a thickness t1 at this stage of about 750 microns.

Figure 5:
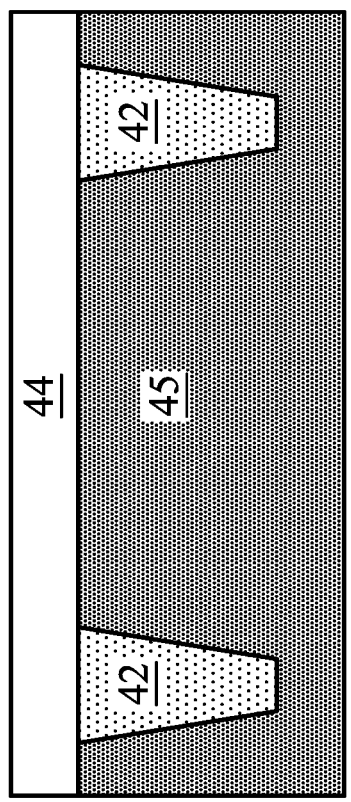
FIG. 5 depicts in a cross sectional view the carrier wafer of FIG. 4 following further oxide deposition processing.

FIG. 5 depicts in a cross sectional view the carrier wafer 41 illustrated in FIG. 4 following additional processing steps. To transition from the intermediate stage of FIG. 4 to the stage shown in FIG. 5, an oxide deposition such as a CVD, PECVD or PVD deposition, or a thermal oxide growth, is used to form an oxide layer 44 over the upper surface of the wafer 45. Layer 44 may be from 0.1 microns to 1 micron thick, for example. This layer 44 is to be used in a subsequent oxide-to-oxide wafer bonding process, as described below, when the carrier wafer 41 may be molecularly bonded to an oxide layer on a surface of the active device wafer (not shown in FIG. 5). The oxide layer 44 has an exposed surface that is relatively flat and smooth and which is compatible with wafer bonding techniques.

Figure 6:
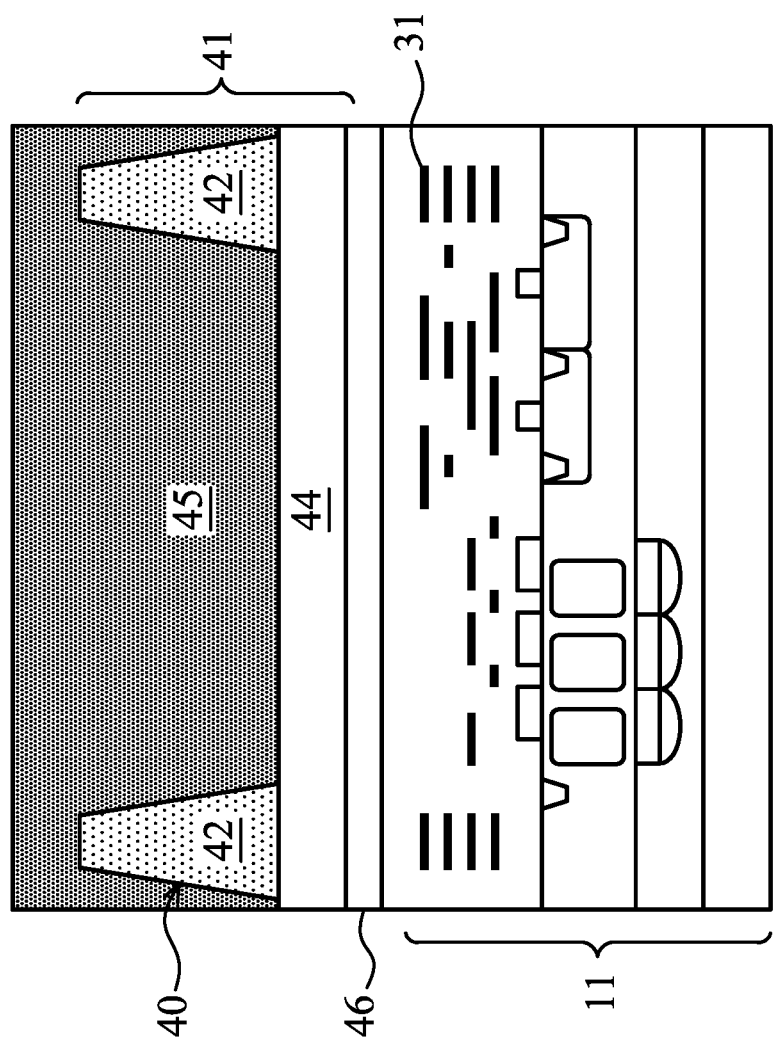
FIG. 6 depicts in a cross sectional view an embodiment having a carrier wafer such as in FIG. 5 bonded to an active device wafer to form an embodiment bonded wafer structure.

FIG. 6 depicts in another cross sectional view the carrier wafer 41 of FIG. 6 after the preparation processes described above are complete and after an oxide to oxide wafer bonding process is performed. The carrier wafer 41 is now shown rotated with the exposed surface facing down, as compared to FIG. 5. The cross section in FIG. 6 is illustrated for clarity but could be shown with the carrier wafer beneath the active device wafer, for example. Now carrier wafer 41 is bonded to the active device wafer 11 (see FIG. 1). An oxide-to-oxide wafer bonding process is used to bond the oxide layer 44 of carrier wafer 41 to an oxide layer 46 formed overlying the front side of wafer 13 of active device wafer 11. Oxide layer 46 may also be thermally grown oxide or may be deposited by CVD, PECVD, PVD over the active device wafer 11 on the front side, and may be from 1 micron to about 2 microns thick. To form the wafer bond, the surfaces of the oxide layers 44 and 46 may be activated by a plasma process, or chemically cleaned, for example, and then placed in physical contact. The wafer bonding may take place at ambient temperature or with increased temperature, and may be performed in a vacuum chamber. In an embodiment, a temperature range from about 150 degrees C. to about 450 degrees C. may be used during the wafer bonding process.

In mounting the carrier wafer 41 to the active device wafer 11, the vias 40 are aligned with certain portions of the top level metallization portions 31 in the active device wafer 11. The vias 40 will be used in subsequent steps (described below) to form vertical through oxide vias that make electrical connections from the upper surface of the carrier wafer 41 to portions of the metallization layers of active device wafer 11.

Figure 7:
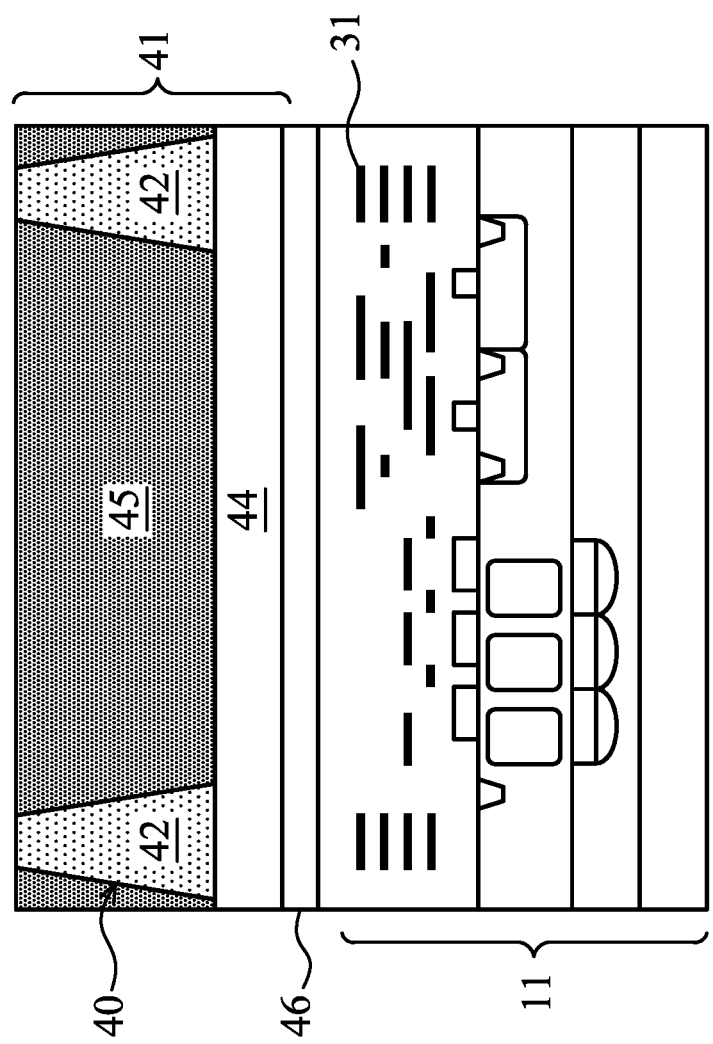
FIG. 7 depicts in a cross sectional view structure of FIG. 6 illustrating the carrier wafer following wafer thinning processing.

FIG. 7 depicts in a cross sectional view the carrier wafer 41 and active device wafer 11 illustrated in FIG. 6 following additional processing steps. To transition from the intermediate stage of FIG. 6 to the process stage shown in FIG. 7, a wafer grinding or wafer thinning operation, which may include mechanical wafer grinding, silicon etching, CMP, or combinations of these processes, is performed on the (now upper) surface of wafer 45 to expose the vias 40, thus forming through vias 40 extending through wafer 45. The through vias 40 remain filled with the HDP oxide material 42.

Figure 8:
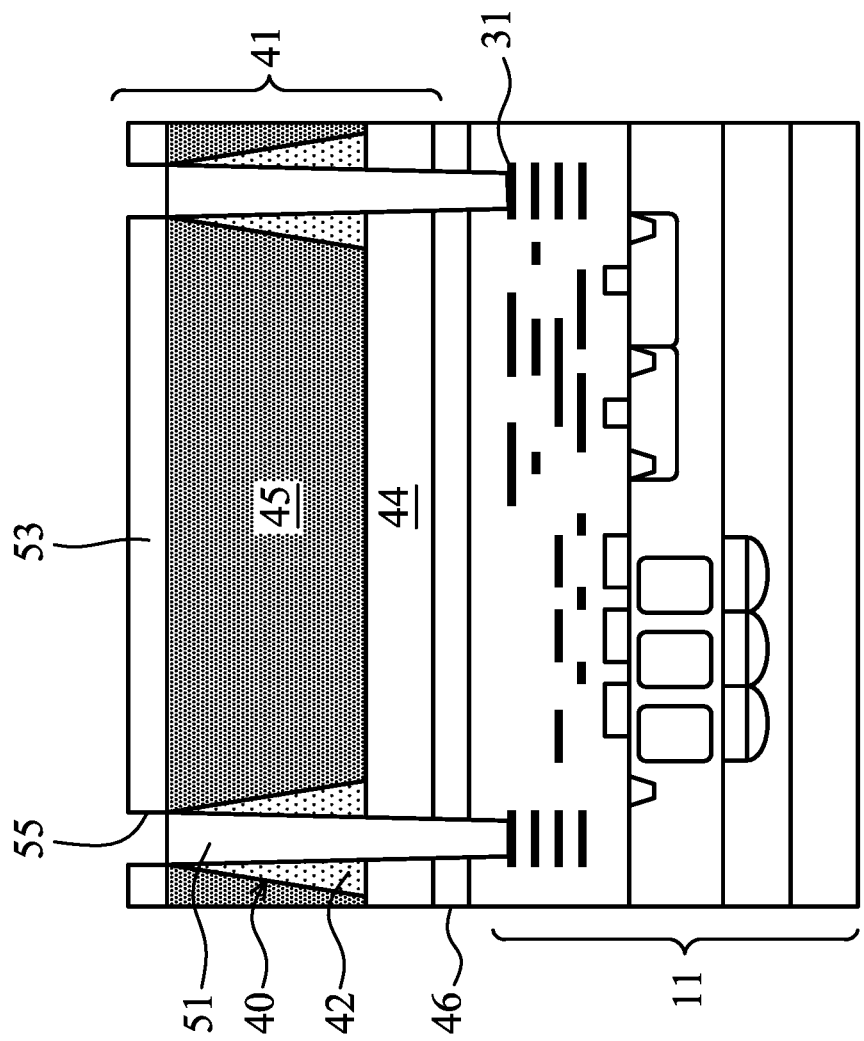
FIG. 8 depicts in a cross sectional view the bonded wafer structure of FIG. 7 following via processing.

FIG. 8 depicts, in the carrier wafer 41 and active device wafer 11 following additional processing. A photoresist or hard mask layer 53 is formed over the exposed surface of carrier wafer 41. Openings 55 are formed in the photoresist or hard mask layer 53, using photolithography and etch processes. Using the openings 55 and using photoresist layer 53 as an etch mask, through oxide vias (TOVs) 51 are formed in the HDP oxide 42 and are extended through the oxide layers 44 and 46 to expose the a portion of the top most layer of the metallization structure 31 in active device wafer 11.

The etch process used to form the TOVs 51 is an oxide etch process, and may be performed by an RIE etch, which is particularly well suited to the high aspect ratio and anisotropic properties in forming a narrow via openings in the HDP oxide 42 and extending into the oxide layers 44, 46. Because the etch is an oxide etch, it may be performed at temperatures that have a relatively low thermal impact on the materials in the active device wafer 11, including for example, the CFA and ML materials. Also, TOVs 51 are etched through HDP oxide 42 and the opening continues into another oxide layer 44 and then into oxide layer 46 so that the entire etch process is oxide etching. In contrast, in the prior approaches, the comparable etch is a silicon through etch through the carrier wafer into oxide layers below, which creates additional thermal stress on the oxides.

The vias 51 are formed after the wafer bonding process and so the process may be considered a "via last" approach.

Comparing the approaches of the embodiments described herein to the prior silicon via etch and thermal oxidation liner formation, the use of the embodiments provides several advantages. Problems that occurred due to the "corner" stresses formed in the prior approach do not occur when the embodiments with the TOVs are used, because in the embodiments the HDP oxide is used to isolate the conductor formed in the vias from the carrier wafer, whereas in the prior approaches the liner oxide deposition that was performed as a low temperature thermal oxide into a high aspect ratio via, creating areas where cracking occurred. Using the embodiments, the HDP oxide forms an isolation layer and so this liner oxide step is no longer performed. In contrast to the problems of the prior approaches, use of the embodiments and the TOVs eliminate the thermal liner oxide and also the reliability issues that accompany it.

Figure 9:
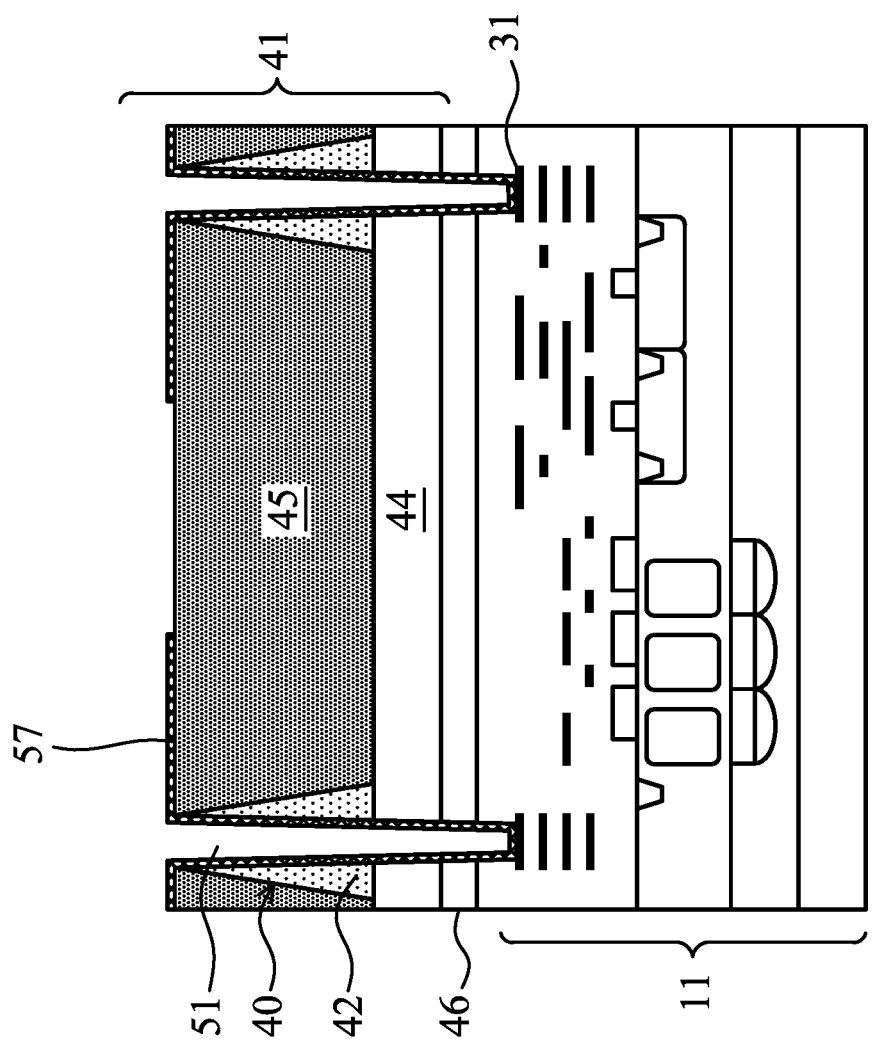
FIG. 9 depicts in a cross sectional view the bonded wafer structure of FIG. 8 following additional processing.

FIG. 9A depicts in a cross sectional view the carrier wafer 41 of FIG. 8 and the active device wafer 11 after additional processing steps. To transition from FIG. 8 to FIG. 9, the photoresist layer 53 is removed, and an electro-chemical plating (ECP) process is used to form a copper (Cu) redistribution layer (RDL) 57 into the sides and bottoms of the vias 51 and extending onto the exposed surface of wafer 45. The RDL 57 may be one of copper or copper alloys, and may include barrier layers and adhesion layers such as titanium nitride, tantalum nitride and the like to prevent copper ion diffusion, for example. One skilled in the art will recognize that liners, barrier layers, seed layers, and the like might be formed in the vias prior to or after formation of the copper or other conductor 57 filling the vias 51.

The RDL 57 is isolated from the wafer 45 in the vias 51 by the HDP oxide 42, so that no additional insulator deposition is needed to maintain this isolation. The RDL 57 extends into the vias 51 and to the exposed portion of the metallization layer 31 in active device wafer 11, and forms an electrical connection from the upper surface of wafer 45, through the through oxide via 51, and on to the metallization layer 31. RDL 57 forms also lies on the surface of the wafer 45 and as shown in FIG. 9, may be patterned to form a plurality of traces on the upper surface of wafer 45. The RDL 57 thus provides trace portions for making external electrical connections to the metallization layer 31 in active device wafer 11.

Figure 10:
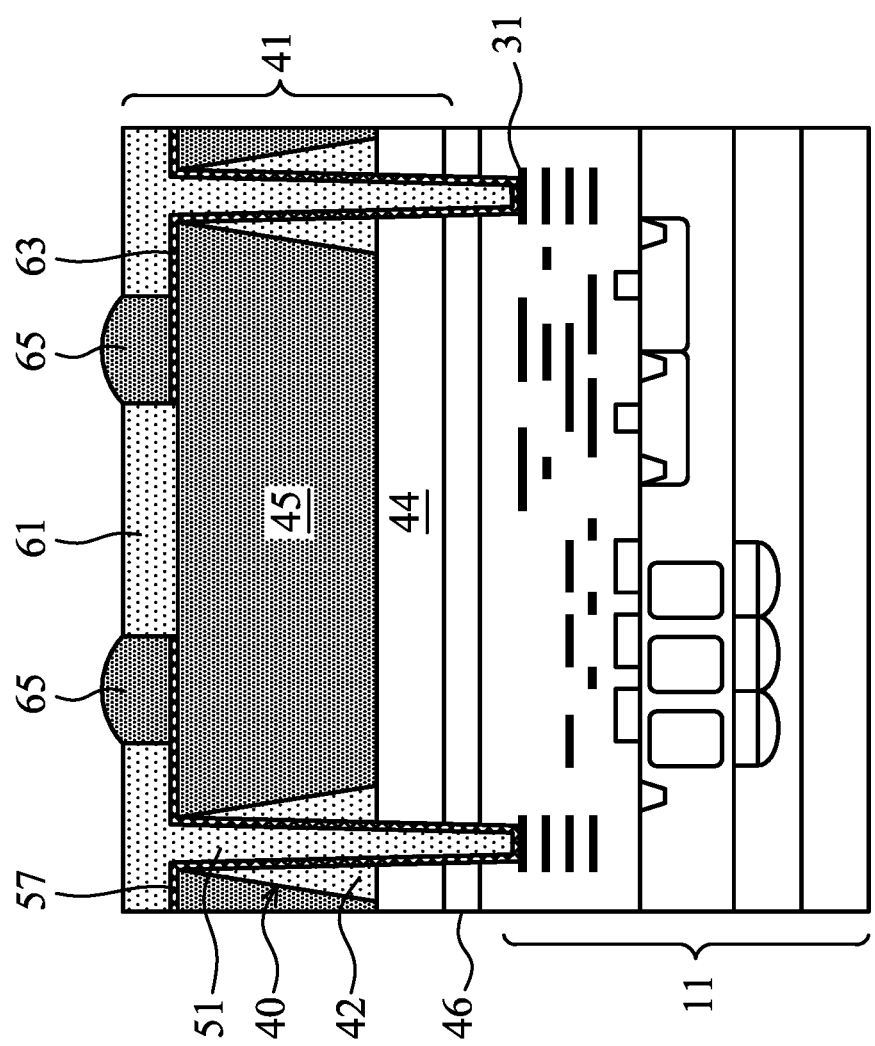
FIG. 10 depicts in a cross sectional view a completed bonded wafer structure of the embodiments.

FIG. 10 depicts in another cross sectional view the carrier wafer 41 and active device wafer 11 of FIG. 9 following additional processing steps. In FIG. 10, the TOVs 51 is shown after a layer of passivation material 61 such as silicon nitride, for example, or another passivation material is deposited over the RDL 57. The passivation material 61 covers the RDL 57 in the vias and over the upper surface of wafer 45. Openings such as 63 are formed in the passivation material 61 and in the openings, terminals 65 are formed. Terminals 65 may be ball grid array (BGA) terminals and form external terminals electrically contacting portions of RDL 57. The BGA terminals 65 are electrically connected to the active device wafer 11 at the metallization layer 31 in the vias 51 by the RDL 57. The BGA terminals 65 may be formed as solder balls or solder bumps and may be deposited on the RDL layer 57 and then subjected to a thermal reflow process, for example, to complete the BGA terminals 65.

In the example embodiment process shown in FIGS. 9 and 10, the RDL 57 is formed with the BGA balls 65 without the need for CMP processes and damascene processes that are often used to pattern copper or other conductors onto vias.

Figure 11:
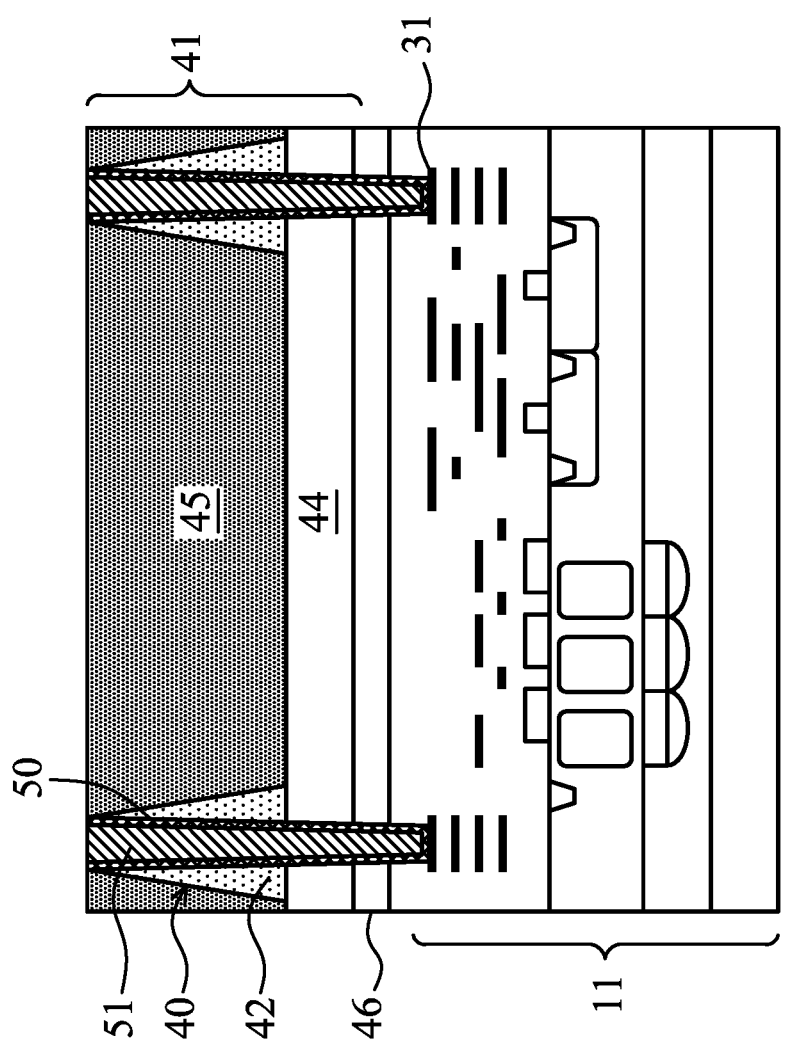
FIG. 11 depicts in a cross sectional view the bonded wafer structure of FIG. 8 following additional processing to illustrate an alternative embodiment.
Figure 12:
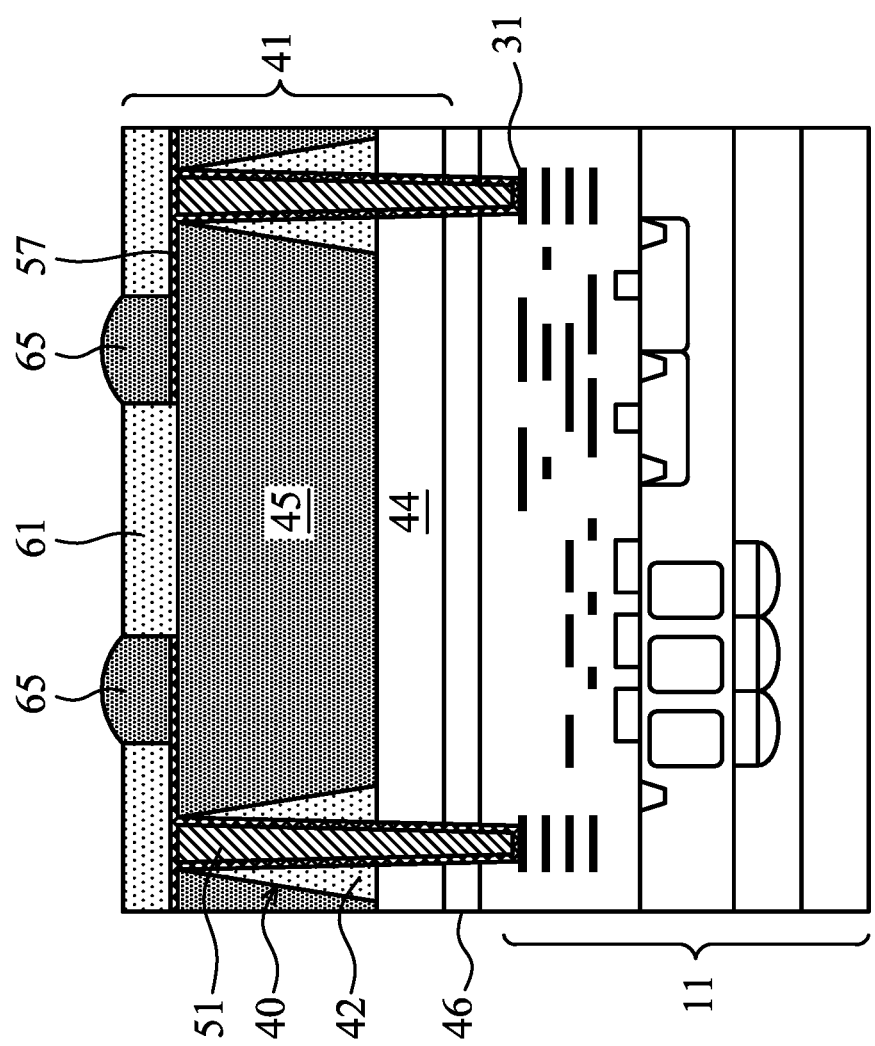
FIG. 12 depicts in a cross sectional view the bonded wafer structure of FIG. 11 following additional processing of the alternative embodiment.

FIGS. 11 and 12 now depict an alternative embodiment example. In FIG. 11, the structure of FIG. 9 is shown in cross-section following additional process steps. A barrier layer such as TaN (tantalum nitride) is formed lining the vias 51. The vias 51 are shown filled with a conductor, such as copper or an alloy, that is formed by an ECP process, followed by a CMP process to remove the overburden and planarize the surface of the vias 51. Thus this process is similar to a damascene process as known for forming copper into vias.

FIG. 12 depicts the structure of FIG. 11 following additional processing steps. In FIG. 12, the vias 51 are shown filled with the copper after the CMP process. An RDL layer 57 is formed of a conductor to form traces over the substrate. This layer may be an Al/Cu alloy, for example, formed by photolithography and etch patterning to form traces coupled to the vias. A passivation layer 61 is formed over the RDL layer 57, openings are formed and BGA balls 65 are formed on the traces to complete the external connections for the active device wafer 11.

The BGA terminals 65 in FIGS. 10 and 12 may be formed of lead-based solder, or lead-free solder, and may be formed of solder including one or more of silver, tin, copper, for example. The BGA terminals form conductive terminals and may not be ball shaped, other shapes may be used such as pillars, columns, studs, stacks of studs, for example, to form alternative embodiments. The BGA terminals 65 may include protective finish layers such as nickel, gold, and palladium, and alloys such as ENIG, ENEPIG, for example. In alternative embodiments, the ball grid array terminals 65 could be replaced with studs, pillars, bond wires, bumps and these could be copper, gold, or other conductive material including solder. Shapes could be columns, studs, pillars, wire bond bumps or wire bond studs, any shape that provides a conductive terminal used for mounting a module or integrated circuit to another board or substrate may be used as the terminals. In some embodiments, stacks of wire bond stud bumps are used with copper or gold wire, for example, as an alternative to the BGA balls 65.

The processes described above and shown in FIGS. 2-10 may be performed in a wafer scale process, that is, the carrier wafer 41 may be bonded to the active device wafer 11 as shown in FIG. 7 and the subsequent steps including forming the TOVs and forming the conductive RDL layer, the passivation layer, and the ball grid array terminals, may all be performed at the wafer level. Alternatively, the devices could be singulated into individual modules, by dicing or sawing operations, after the wafer bonding steps, to form integrated circuit modules, and then the individual integrated circuit modules could be completed. Wafer level processing is increasingly used due to the economies of scale and efficiency, however, the embodiments are not to be limited to wafer level processing embodiments.

As an advantage of the use of the embodiments described herein, it is believed that the process conditions required for etching the TOVs through an HDP oxide (or similar oxide) are less stressful, in terms of thermal budget and mechanical stress, than the thermal conditions for etching in the prior approaches, e.g., silicon substrate etching of the carrier wafer, while the active device wafer is already bonded to it. Further, it is believed that the HDP oxide surrounding the conductor within the TOVs of the embodiments may further improve reliability by eliminating the oxide cracks and conductor extrusions observed when forming through-vias in the prior approaches.

In an example embodiment, a method includes forming at least one via in a carrier wafer; filling the at least one via with an oxide; mounting the carrier wafer to a second wafer; etching a through via through the oxide filling the at least one via to form a through oxide via; and filling the through oxide via with a conductor. In a further embodiment, the oxide in the above method is a high density plasma (HDP) oxide. In another embodiment, the method further includes thinning the carrier wafer. In still a further embodiment, in the above method, the at least one via extends from a first surface of the carrier wafer into the carrier wafer and does not extend to a second surface of the carrier wafer, prior to the thinning step. In still another embodiment, in the above method the second wafer includes an image sensor. In another example embodiment, in the above methods the second wafer includes a conductive interconnect and wherein the through oxide via extends further to expose the conductive interconnect. In still a further embodiment, in the above methods, the conductor fills the through oxide via and makes electrical connection to the conductive interconnect. In still other embodiments, the conductor is copper. In another embodiment, the above methods are performed and further include forming external terminals over the carrier wafer and in electrical contact with the conductor. In yet another embodiment, in the above methods, the conductor is copper.

In further embodiments, a method includes providing an active device wafer having a front side including conductive interconnect material disposed in dielectric layers and having an opposing back side; providing a carrier wafer having through vias filled with an oxide extending from a first surface of the carrier wafer to a second surface of the carrier wafer; bonding the second surface of the carrier wafer to the front side of the active device wafer; etching the oxide in the through vias to form through oxide vias extending from the first surface of the carrier wafer into the dielectric layers of the active device wafer to expose a portion of the conductive interconnect material in the dielectric layers; and depositing conductor material into the through oxide vias to form conductors that make electrical contact to the conductive interconnect material.

In further embodiments in the above method, the active device wafer further includes CMOS image sensors. In still another embodiment, the above methods include wherein the CMOS image sensors are back side illuminated image sensors. In yet another embodiment, in the above methods, the methods include depositing the conductor material onto the second surface of the carrier wafer; patterning the conductor material on the second surface of the carrier wafer to form conductive traces coupled to the conductor material in the through oxide vias; and forming external connectors coupled to the conductive traces.

In still another embodiment, in the above methods forming external connectors includes forming passivation material over the second surface of the carrier wafer and covering the conductive traces; patterning openings in the passivation material to expose portions of the conductive traces; and forming external connectors in the openings. In still another embodiment, the above methods include wherein depositing conductor material further includes depositing copper. In still another embodiment, in the above methods, the methods include forming external connectors including forming one selected from the group consisting essentially of solder balls, columns, pillars, studs, solder bumps, wire bonds.

In another embodiment, an apparatus includes an active device wafer having a wafer including a plurality of electrical devices and having conductive interconnects disposed on a front side surface: and a carrier wafer disposed over the front side surface of the active device wafer and wafer bonded to the active device wafer, the carrier wafer further including: through vias extending through the carrier wafer and having an oxide material formed within the through vias; through oxide vias extending through the oxide material in the through vias, the through oxide vias extending to expose a portion of the conductive interconnects of the active device wafer; conductive material deposited in the through oxide vias, the conductive material electrically contacting the exposed portion of the conductive interconnects of the device wafer; and external connectors formed over the carrier wafer and electrically connected to the conductive material.

In still another embodiment, in the apparatus above, the conductive material is copper. In yet another embodiment, in the apparatus above, the active device wafer includes backside illuminated CMOS image sensors.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. An imaging device, comprising:
   a semiconductor substrate having a first side and a second side;
   a photodiode; and
   a through structure extending through the semiconductor substrate, the photodiode being electrically connected to the photodiode, the through structure comprising:
   a through via extending through the semiconductor substrate,
   an insulating material layer within the through via,
   through insulating via extending through the insulating material layer in the through via, and
   conductive material layer in the through insulating via, wherein a thickness of the insulating material layer between the semiconductor substrate and the conductive material layer continuously increases from a first plane of the first side of the semiconductor substrate to a second plane of the second side of the semiconductor substrate, wherein the conductive material layer protrudes from the second side of the semiconductor substrate and the insulating material layer, wherein an end of the conductive material layer is horizontally level with the first side of the semiconductor substrate.

2. The imaging device of claim 1, further comprising a first insulating layer on the second side of the semiconductor substrate, wherein the conductive material layer extends continuously through the first insulating layer.

3. The imaging device of claim 1, wherein a surface of the insulating material layer is level with a surface of the second side of the semiconductor substrate.

4. The imaging device of claim 3, wherein the through insulating via completely separates the conductive material layer from the semiconductor substrate.

5. The imaging device of claim 1, wherein a diameter of the conductive material layer at the first plane of the first side of the semiconductor substrate is different than a diameter of the conductive material layer at the second plane of the second side of the semiconductor substrate.

6. The imaging device of claim 1, wherein the semiconductor substrate is carrier substrate, and the photodiode is on an active substrate bonded to the carrier substrate.

7. The imaging device of claim 1, wherein the through structure further comprises a dielectric material over the conductive material layer.

8. An imaging device, comprising:
   a semiconductor substrate having a first side surface and a second side surface;
   a photosensor; and
   a through structure including a conductive element and an insulating film, wherein the conductive element is electrically coupled to the photosensor, wherein a surface of the insulating film is horizontally level with the first side surface of the semiconductor substrate, wherein the conductive element protrudes from the first side surface of the semiconductor substrate;
   wherein a first thickness of the insulating film between the semiconductor substrate and the conductive element at a first plane of the first side surface of the semiconductor substrate is different than a second thickness of the insulating film between the semiconductor substrate and the conductive element at a second plane of the second side surface of the semiconductor substrate; and
   wherein in a cross-sectional view the conductive element has a first sidewall contacting the insulating film and a second sidewall contacting the insulating film, wherein a first distance between the first sidewall and the second sidewall in the first plane is different than a second distance between the first sidewall and the second sidewall in the second plane.

9. The imaging device of claim 8, wherein the first thickness is greater than the second thickness, wherein the first side surface of the semiconductor substrate is closer to the photosensor than the second side surface of the semiconductor substrate.

10. The imaging device of claim 8, wherein the conductive element completely fills a region in the insulating film.

11. The imaging device of claim 8, further comprising an insulating layer, wherein the semiconductor substrate is between the photosensor and the insulating layer, wherein the conductive element extends into the insulating layer.

12. The imaging device of claim 11, wherein the insulating film is not interposed between a sidewall of the conductive element and the insulating layer.

13. The imaging device of claim 12, wherein the insulating film directly contacts the insulating layer.

14. The imaging device of claim 8, wherein the first distance is less than the second distance, wherein the first side surface of the semiconductor substrate is closer to the photosensor than the second side surface of the semiconductor substrate.

15. An imaging device, comprising:
  a semiconductor substrate having a first side and a second side;
  a photosensor; and
  a through electrode structure extending from the first side of the semiconductor substrate to the second side of the semiconductor substrate, the through electrode structure including a conductive layer and an insulating film, the conductive layer protruding from the insulating film and being electrically coupled to the photosensor,
  wherein the first side of the semiconductor substrate is horizontally level with a first surface of the insulating film, wherein the first side of the semiconductor substrate and the first surface of the insulating film faces a same direction, and
  wherein sidewalls of the insulating film facing the semiconductor substrate are linear from the first side to the second side, wherein a first width of the insulating film at the first side is different than a second width of the insulating film at the second side.

16. The imaging device of claim 15, wherein the second side of the semiconductor substrate is closer to the photosensor than the first side of the semiconductor substrate.

17. The imaging device of claim 16, further comprising an insulating layer, wherein the insulating layer is between the semiconductor substrate and the photosensor, wherein the conductive layer extends through the insulating layer.

18. The imaging device of claim 17, wherein the insulating layer directly contacts sidewalls of the conductive layer.

19. The imaging device of claim 16, wherein the first width is less than the second width.

20. The imaging device of claim 15, wherein the photosensor is part of a sensor substrate bonded to the semiconductor substrate.

* * * * *